(12) United States Patent
Yamamoto et al.

(10) Patent No.: US 7,474,170 B2
(45) Date of Patent: Jan. 6, 2009

(54) ATTENUATOR

(75) Inventors: Kazuya Yamamoto, Tokyo (JP); Miyo Miyashita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 76 days.

(21) Appl. No.: 11/678,643

(22) Filed: Feb. 26, 2007

(65) Prior Publication Data

US 2008/0088392 A1   Apr. 17, 2008

(30) Foreign Application Priority Data

Oct. 11, 2006  (JP) .............................. 2006-278001

(51) Int. Cl.
*H01P 1/22* (2006.01)

(52) U.S. Cl. ..................................... 333/81 R; 327/308

(58) Field of Classification Search ............... 333/81 R, 333/81 A; 327/308

See application file for complete search history.

(56) References Cited

U.S. PATENT DOCUMENTS

2003/0218500 A1   11/2003   Yamamoto et al.

FOREIGN PATENT DOCUMENTS

JP         2003-347870         12/2003

OTHER PUBLICATIONS

Yamamoto et al., "A 0/20-dB Step Linearized Attenuator with GaAs-HBT Compatible, AC-Coupled, Stack Type Base-Collector Diode Switches", IEEE MTT-S International Microwave Symposium Digest, pp. 1693-1696, (2006).
U.S. Appl. No. 11/465,866, filed Aug. 21, 2006, Yamamoto et al.
U.S. Appl. No. 11/553,563, filed Oct. 27, 2006, Yamamoto et al.

*Primary Examiner*—Stephen E Jones
(74) *Attorney, Agent, or Firm*—Leydig, Voit & Mayer, Ltd.

(57) ABSTRACT

A linearizer includes fifth diodes, a third resistor, sixth diodes, and a first npn heterojunction bipolar transistor. When a low-level voltage is applied to first and fourth control voltage terminals and a high-level voltage is applied to second and third control voltage terminals, a low-level voltage is applied to a fifth control voltage terminal, and when a high-level voltage is applied to the first and fourth control voltage terminals and a low-level voltage is applied to the second and third control voltage terminals, a high-level voltage is applied to the fifth control voltage terminal.

6 Claims, 13 Drawing Sheets

ATTENUATOR

BACKGROUND OF THE INVENTION

1. Field of the Invention

The present invention relates to an AC-coupled, DC stacked type BC diode attenuator, and more particularly, to an attenuator capable of tolerating a comparable degree of a distortion characteristic up to a comparable degree of transmit power in a thru state and an attenuation state and an attenuator capable of compensating for a gain compression characteristic of a power amplifier in a thru state.

2. Background Art

A GaAs-HBT (hetero junction bipolar transistor) power amplifier is widely used as a power amplifier for a cellular phone carrying out CDMA (Code Division Multiple Access) or a power amplifier for a wireless LAN in recent years.

Since the GaAs-HBT requires no negative base bias voltage, it can operate with a single power supply and obtain a more uniform device characteristic than a GaAs-FET. Therefore, the GaAs-HBT has been increasingly applied to a GaAs-based power amplifier such as a cellular phone and a wireless LAN in recent years.

However, when an RF (high frequency) switch element is constructed in a normal GaAs-HBT process, it is not possible to form a switch which can turn ON only through application of a base voltage. Therefore, a switch using a base-collector junction diode (BC diode) having a junction similar to a p-i-n junction is used (for example, see Japanese Patent Laid-Open No. 2003-347870).

FIG. 14 is a circuit diagram showing a conventional switch using a BC diode. This switch includes a diode D1 whose anode is connected to an input terminal IN and whose cathode is connected to an output terminal OUT, a control voltage terminal Vc1 connected to the anode of the diode D1 via an RF blocking inductor L1, and a resistor R1 and an RF blocking inductor L2 connected in series between the cathode of the diode D1 and a grounding point.

In the switch in FIG. 14, when a voltage equal to or above an ON voltage (approximately 1.25 V) of the diode D1 is applied to the control voltage terminal Vc1, the diode D1 is changed from an OFF state to an ON state and an electric current Idc determined by the resistor R1 flows through the diode D1. In this way, when the diode D1 turns ON, an RF signal inputted from the input terminal IN is transmitted to the output terminal OUT. On the other hand, when a voltage (also including a negative bias) which is smaller than the ON voltage of the diode D1 is applied to the control voltage terminal Vc1, the diode D1 turns OFF and prevents the transmission of the RF signal.

Furthermore, FIG. 15 is a circuit diagram showing a conventional attenuator using a BC diode. In addition to the configuration in FIG. 14, it includes a resistor R01 whose one end is connected to the anode of a diode D1, a resistor R02 whose one end is connected to the cathode of the diode D1, a diode D2 whose anode is grounded via a capacitor C2 and whose cathode is connected to the other end of the resistor R01 via a capacitor C1 and the cathode connected to the other end of the resistor R02 and a control voltage terminal Vc2 connected to the anode of the diode D2 via an RF blocking inductor L2 and the resistor R4.

In the attenuator in FIG. 15, when a voltage equal to or above an ON voltage of the diode D1 is applied to a control voltage terminal Vc1 and a voltage smaller than an ON voltage of the diode D2 (also including a negative bias) is applied to the control voltage terminal Vc2, a "thru state" is set in which an RF signal inputted from the input terminal IN is transmitted to the output terminal OUT as is. On the other hand, when a voltage smaller than the ON voltage of the diode D1 is applied to the control voltage terminal Vc1 and a voltage equal to or above the ON voltage of the diode D2 is applied to the control voltage terminal Vc2, an attenuation state determined by the resistors R01 and R02, and the ON resistance of the diode D2 is set. However, when the capacitors C1 and C2 are fabricated on a GaAs chip, the capacitance thereof becomes small, and therefore the impedance values in the operating frequency bands of the capacitors C1 and C2 also become factors for determining the amount of attenuation.

Here, FIG. 16 shows an RF signal inputted from the input terminal IN. The RF signal is expressed by an electric current I (t) which passes through the diode D1 and the maximum value of the amplitude is Imax and the period is T. The allowable input power is limited to a level at which insertion loss does not increase in the value of the bias current Idc applied to the diode D1. More specifically, as shown in Expression (1), the allowable input power is limited so that the time integrated value of the half wave of the current I (t) which passes through the diode D1 (equivalent to the total amount of charge in the half wave) becomes smaller than the product of the bias current Idc and a time constant τ. Here, the time constant τ is determined by a junction material of the diode and a junction state (concentration and thickness of an i layer (high resistance layer) or the like).

$$\int_0^{T/2} I(t)\,dt = I\max/(\pi * f) < idc * \tau \qquad (1)$$

Therefore, under a condition under which the bias current Idc is the same, a signal can only pass with smaller power as the frequency lowers. Especially, when a BC diode is fabricated in a GaAs-HBT process, a BC layer is determined by an RF characteristic of the HBT, and therefore there is no degree of freedom in the structural design of the BC layer. Furthermore, since the time constant τ of a GaAs-based diode is smaller by approximately double digits compared to a Si-based p-i-n diode, the allowable input power is quite small. Therefore, when the BC diode is applied to a switch or an attenuator, a large bias current needs to be passed to obtain desired allowable transmit power.

To solve this problem, the inventor invented a switch shown in FIG. 17 and FIG. 18 and an attenuator using the switch.

The switch in FIG. 17 includes a diode D1 whose anode is connected to an input terminal IN and whose cathode is connected to an output terminal OUT, a control voltage terminal Vc1 which is connected to the anode of the diode D1 via an RF blocking inductor L1, a diode D2 whose anode is connected to the cathode of the diode D1 and whose cathode is connected to the anode of the diode D1 via a capacitor C1, and a resistor R1 and an RF blocking inductor L2 connected in series between the cathode of the diode D2 and a grounding point.

In the attenuator in FIG. 18, the anode of a diode D1 is connected to an input terminal IN and the cathode of the diode D1 is connected to an output terminal OUT. Furthermore, a control voltage terminal Vc1 is connected to the anode of the diode D1 via an RF blocking inductor L1. The anode of a diode D2 is connected to the cathode of the diode D1 and the cathode of the diode D2 is connected to the anode of the diode D1 via a capacitor C1.

Furthermore, one end of a resistor R01 is connected to the cathode of the diode D2 and one end of a resistor R02 is connected to the cathode of the diode D1 via a capacitor C2. The anode of a diode D3 is connected to the other ends of the resistors R01 and R02 via a capacitor C3 and the cathode of a diode D4 is connected to the other ends of the resistors R01 and R02 via a capacitor C4. Furthermore, one end of a capacitor C5 is connected to the cathode of thee diode D3 and the anode of the diode D4 and the other end of the capacitor C5 is grounded.

Furthermore, a control voltage terminal Vc2 is connected to the cathode of the diode D2 via an RF blocking inductor L2 and a resistor R2. A control voltage terminal Vc3 is connected to the anode of the diode D3 via an RF blocking inductor L3 and a resistor R3. Moreover, a control voltage terminal Vc4 is connected to the cathode of the diode D4 via an RF blocking inductor L4 and a resistor R4.

In the attenuator in FIG. 18, when a voltage (high level) equal to or above ON voltages of the diodes D1 and D4 is applied to the control voltage terminals Vc1 and Vc4 and a voltage (low-level) smaller than ON voltages of the diodes D2 and D3 is applied to the control voltage terminals Vc2 and Vc3, a thru state is set in which the RF signal inputted from the input terminal IN is transmitted to the output terminal OUT as is. On the contrary, a voltage (low-level) smaller than the ON voltages of the diodes D1 and D4 is applied to the control voltage terminals Vc1 and Vc4 and a voltage (high level) equal to or above the ON voltages of diodes D2 and D3 is applied to the control voltage terminals Vc2 and Vc3, an attenuation sate is set. The amount of attenuation is determined by the resistors R01 and R02, capacitance values of the capacitors C1 to C6, bias current Idc and bias voltage.

Furthermore, the diodes D1 and D2 are connected in series in terms of a direct current and connected in parallel via the capacitor C1 in terms of an alternating current. In this way, when a high-level voltage is applied to the control voltage terminal Vc1, the DC bias current Idc commonly flows through the diodes D1 and D2. On the other hand, in terms of an alternating current, this is equivalent to double Idc flowing, and therefore the bias current Idc apparently approximately doubles and Imax in Expression (1) approximately doubles. Therefore, since allowable transmit power is expressed by Ro·Imax·Imax/2 (Ro is characteristic impedance of the system), the allowable transmit power improves approximately four times that of the circuit in FIG. 15.

FIG. 19 shows a thru power characteristic of the attenuator in FIGS. 15 and 18. As shown in the figure, the circuit in FIG. 18 shows the allowable transmit power improved by approximately 6 to 8 dB compared to the circuit in FIG. 15.

FIG. 20 shows an output characteristic of the attenuator in FIG. 18 in an attenuation state. Here, signal distortion is expressed by tertiary mutual modulation distortion Pim3 when two signals are input As a result of an experiment, a drastic increase of signal distortion was observed at the time of high power input in an attenuation state of 20 dB. Such drastic increase of signal distortion was not observed in a thru state. Such an increase of signal distortion is not desirable because it leads to deterioration of signal quality in the system using a modulated signal or the like.

Therefore, the inventor invented an attenuator which adds a linearizer L to the circuit in FIG. 18 as shown in FIG. 21. This linearizer L is provided between an input terminal IN and the anode of a diode D1. The linearizer L includes a diode D5 whose anode is grounded and whose cathode is connected to a connection point between the input terminal IN and the anode of the diode D1 and a resistor RLT1 connected between a connection point between the input terminal IN and the anode of the diode D1 and a control voltage terminal Vc5.

Here, when the control voltage terminal Vc5 is at high level (e.g., 5 V), a large reverse bias voltage is applied to the diode D5 and the linearizer L does not operate. On the other hand, when the VcL is driven to low level (e.g., 0 V), the linearizer L operates. When an input power Pin is high, a gain Gp of the linearizer L decreases. Therefore, the gain of the attenuator increases at the time of high power input.

Therefore, a setting is made such that a low-level voltage is applied to the control voltage terminal Vc5 only in the attenuation state. In this way, the linearizer L operates only in the attenuation state and linearizes the signal inputted from the input terminal IN. Therefore, in a thru state, the linearizer L does not operate and the attenuator shows a thru state characteristic in FIG. 20.

FIG. 22 shows a characteristic at the time of attenuation of the attenuator in FIG. 21. The flat section of a gain Gp is improved as shown by a dotted line and the characteristic of tertiary distortion Pim3 is also improved accordingly. Therefore, this attenuator can improve the distortion characteristic at the time of high power input in the attenuation state, and therefore it is possible to tolerate a comparable degree of the distortion characteristic up to a comparable degree of transmit power in the thru state and the attenuation state. Furthermore, as in the case of the attenuator in FIG. 18, it is also possible to improve the allowable transmit power by approximately 6 dB or more with the same bias current compared to the circuit in FIG. 15.

Furthermore, since the attenuator ATT in FIG. 21 has large allowable transmit power with a low bias current, even if it is provided between the stages of power amplifiers A1 to A3 as shown in FIG. 23, distortion produced from the attenuator ATT is small. Therefore, it is possible to provide a power amplifier which has a low noise characteristic.

Here, a normal power amplifier has a gain compression characteristic as shown in FIG. 24. Most part of the gain compression characteristic is produced in the power amplifier section, but some part of the gain compression characteristic is produced in the attenuator section in a thru state, too. Therefore, a linearizer having a gain expansion characteristic needs to be provided before the power amplifier to extend the linear area (area where the gain is flat) as much as possible. However, the attenuator in FIG. 21 has no function of compensating for the gain compression characteristic of the power amplifier in a thru state, and therefore it is necessary to provide a different linearizer having a gain expansion characteristic before the power amplifier or between stages, which results in a problem of causing the chip area to increase.

SUMMARY OF THE INVENTION

The present invention has been implemented to solve the above described problems and it is an object of the present invention to provide an attenuator capable of tolerating a comparable degree of a distortion characteristic up to a comparable degree of transmit power in a thru state and an attenuation state and compensating for the gain compression characteristic of the power amplifier in the thru state.

According to one aspect of the present invention, a linearizer has fifth diodes, a third resistor, sixth diodes and a first npn HBT. When a low-level voltage is applied to first and fourth control voltage terminals and a high-level voltage is applied to second and third control voltage terminals, a low-level voltage is applied to a fifth control voltage terminal, a high-level voltage is applied to the first and fourth control voltage terminals and a low-level voltage is applied to the second and third control voltage terminals, a high-level voltage is applied to the fifth control voltage terminal.

With the present invention, it is possible to tolerate a comparable degree of a distortion characteristic up to a comparable degree of transmit power in a thru state and an attenuation state and further compensate for the gain compression characteristic of a power amplifier in the thru state.

Other and further objects, features and advantages of the invention will appear more fully from the following description.

DETAILED DESCRIPTION OF THE PREFERRED EMBODIMENTS

Embodiment 1

Figure 1:
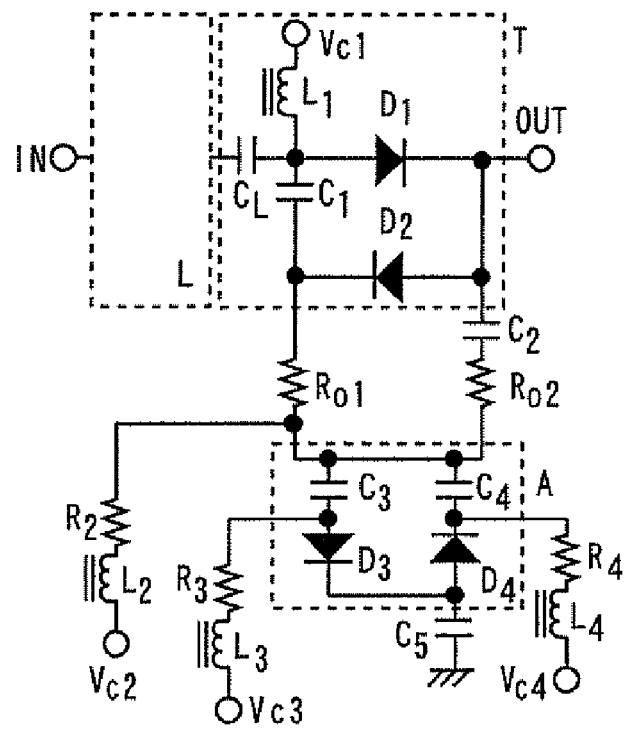
FIG. 1 is a circuit diagram showing an attenuator according to Embodiment 1 of the present invention.

FIG. 1 is a circuit diagram showing an attenuator according to Embodiment 1 of the present invention. The anode of a diode D1 (first diode) is connected to an input terminal IN and the cathode of the diode D1 is connected to an output terminal OUT. Furthermore, a control voltage terminal Vc1 (first control voltage terminal) is connected to the anode of the diode D1 via an RF blocking inductor L1. The anode of a diode D2 (second diode) is connected to the cathode of the diode D1 and the cathode of the diode D2 is connected to the anode of the diode D1 via a capacitor C1 (first capacitor).

Furthermore, one end of a resistor R01 (first resistor) is connected to the cathode of the diode D2 and one end of a resistor R02 (second resistor) is connected to the cathode of the diode D1 via a capacitor C2 (second capacitor). The anode of a diode D3 (third diode) is connected to the other ends of the resistors R01 and R02 via a capacitor C3 (third capacitor) and the cathode of a diode D4 (fourth diode) is connected to the other ends of resistors R01 and R02 via a capacitor C4 (fourth capacitor). Moreover, one end of a capacitor C5 (fifth capacitor) is connected to the cathode of the diode D3 and the anode of the diode D4 and the other end of the capacitor C5 is grounded.

Furthermore, a control voltage terminal Vc2 (second control voltage terminal) is connected to the cathode of the diode D2 via an RF blocking inductor L2 and a resistor R2. A control voltage terminal Vc3 (third control voltage terminal) is connected to the anode of the diode D3 via an RF blocking inductor L3 and a resistor R3. Moreover, a control voltage terminal Vc4 (fourth control voltage terminal) is connected to the cathode of the diode D4 via an RF blocking inductor L4 and a resistor R4.

Figure 2:
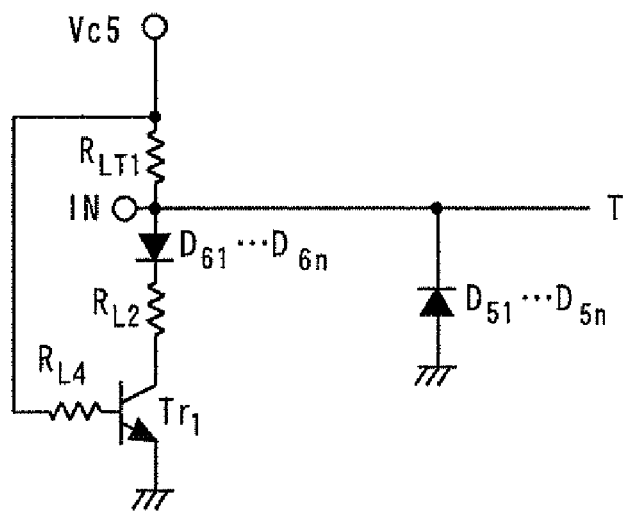
FIG. 2 is a circuit diagram showing a linearizer according to Embodiment 1 of the present invention.

Furthermore, a linearizer L is provided between the input terminal IN and the anode of the diode D1. As shown in FIG. 2, the linearizer L according to this embodiment 1 includes diodes D51 to D5n (fifth diodes) whose anodes are grounded, whose cathodes are connected to a connection point of the input terminal IN and the anode of the diode D1, a resistor RLT1 (third resistor) connected between a connection point of the input terminal IN and the anode of the diode D1 and a control voltage terminal Vc5 (fifth control voltage terminal), and a first npn HBT Tr1 whose base is connected to the control voltage terminal Vc5 via a resistor RL4, whose emitter is grounded and whose collector is connected to the cathodes of the diodes D61 to D6n via a resistor RL2. The anodes of diodes D61 to D6n (sixth diodes) are connected to the input terminal IN. However, the diodes D51 to D5n and the diodes D61 to D6n represent n vertically stacked diode sections respectively. Vertical stacking indicates a state of a serial connection such that the anode of D52 is connected to the cathode of D51.

Here, when a low-level (e.g., 0 V) voltage is applied to the control voltage terminals Vc1 and Vc4 and a high-level voltage (e.g., 5 V) is applied to the control voltage terminals Vc2 and Vc3, since a thru arm T turns OFF and an attenuation arm A turns ON, the attenuator is placed in an attenuation state (for example, an attenuation state of 20 dB). In this case, a low-level voltage is applied to the control voltage terminal Vc5. This causes the first npn HBT Tr1 to turn OFF and no current flows through the diodes D61 to D6n. On the other hand, the diodes D51 to D5 are zero-biased and when large signal power is inputted to the input terminal IN, a DC current flows through the diodes D51 to D5n and this DC current flows into the low-level control voltage terminal Vc5 via the resistor RLT1. Therefore, it operates as a linearizer. As a result, the linearizer L presents an output characteristic shown in FIG. 3, and therefore it is possible to improve a distortion characteristic as shown in FIG. 22 as in the case of the circuit in FIG. 21.

Figure 4:
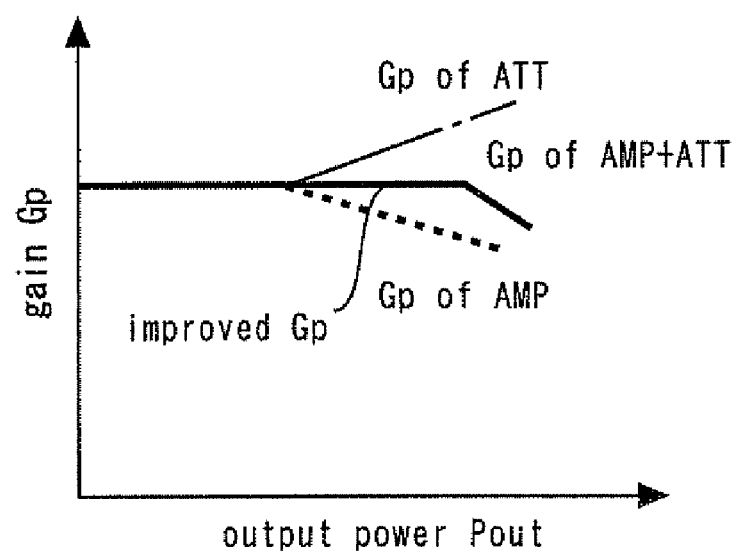
FIG. 4 shows an output characteristic of the linearizer in FIG. 2 in an thru state.

On the other hand, when a high-level voltage is applied to the control voltage terminals Vc1 and Vc4 and a low-level voltage is applied to the control voltage terminals Vc2 and Vc3, the thru arm T turns ON and the attenuation arm A turns OFF, and therefore the attenuator is placed in a thru state (for example, 0 dB non-attenuation state). In this case, a high-level voltage is applied to the control voltage terminal Vc5. This causes the first npn HBT Tr1 to turn ON, and the diodes D51 to D5$n$ to turn OFF with a large reverse bias, whereas the diodes D61 to D6$n$ turn ON. As a result, the linearizer L presents a characteristic of gain expansion shown in FIG. 4. That is, the gain Gp of the attenuator ATT increases when the output power Pout increases, and therefore it is possible to compensate for the gain compression characteristic of the power amplifier AMP by connecting the attenuator ATT of the present invention to the power amplifier AMP.

Figure 21:
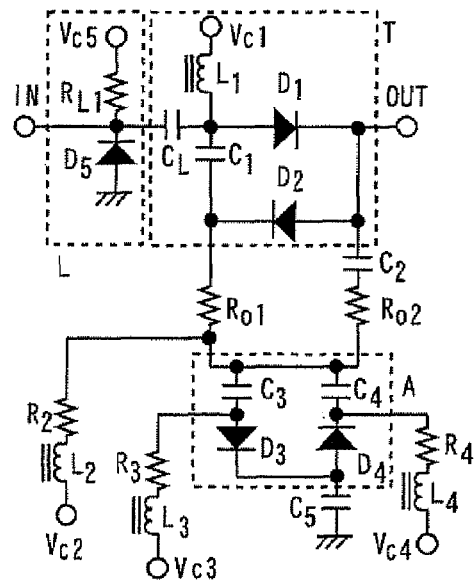
FIG. 21 is a circuit diagram showing a improved attenuator.
Figure 22:
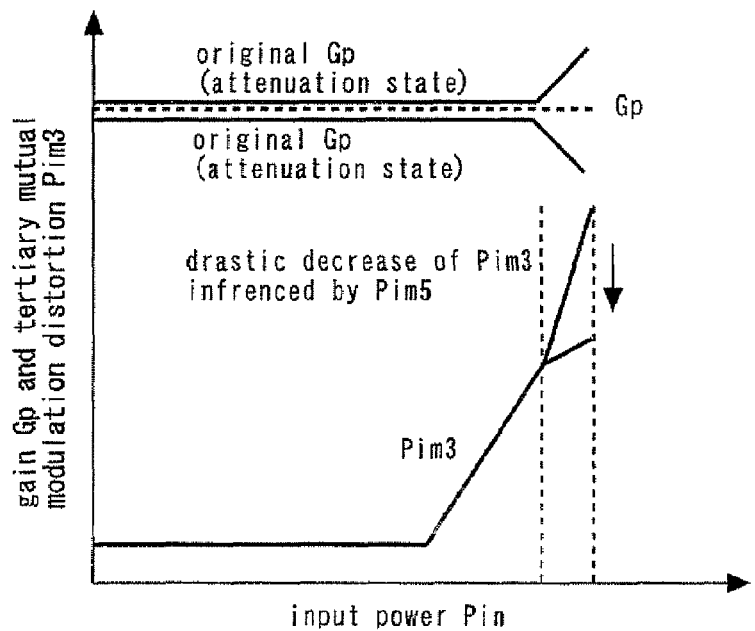
FIG. 22 shows a characteristic at the time of attenuation of the attenuator in FIG. 21.
Figure 23:
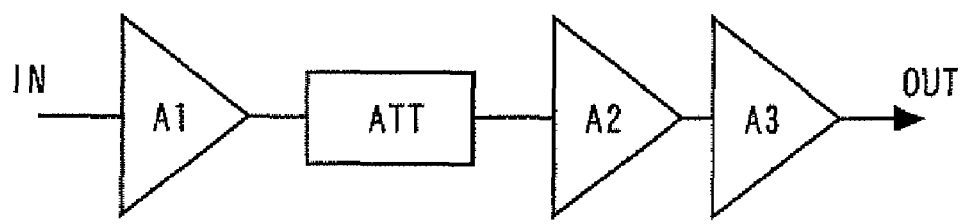
FIG. 23 shows a state that the attenuator in FIG. 21 is provided between the stages of power amplifiers.
Figure 24:
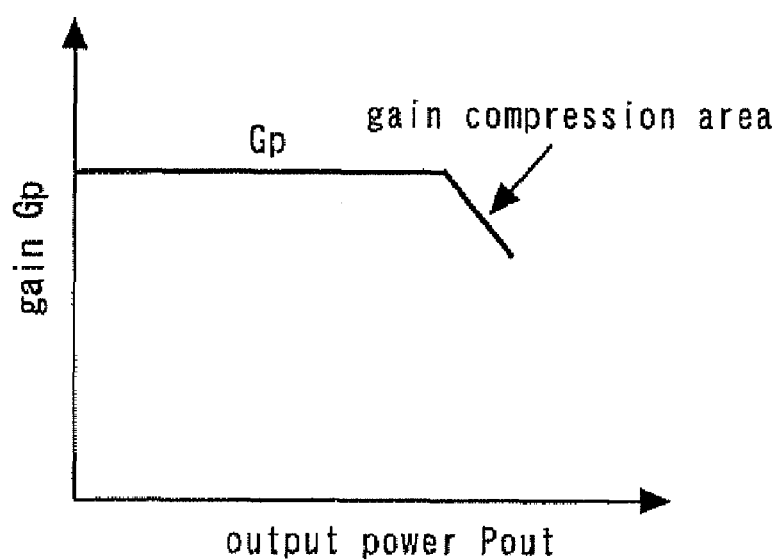
FIG. 24 shows a gain compression characteristic of a normal power amplifier.

Furthermore, since the attenuator according to this embodiment can improve a distortion characteristic at the time of high power input in an attenuation state as in the case of the attenuator in FIG. 21, it is possible to tolerate a comparable degree of the distortion characteristic up to a comparable degree of transmit power in the thru state and the attenuation state. The linearizer L is constructed of only small elements such as resistors, transistors and diodes and there is no necessity for providing any DC cutting capacitor between the diodes D51 to D5$n$ and diodes D61 to D6$n$, and therefore it is possible to reduce the size of the overall chip.

Embodiment 2

Figure 5:
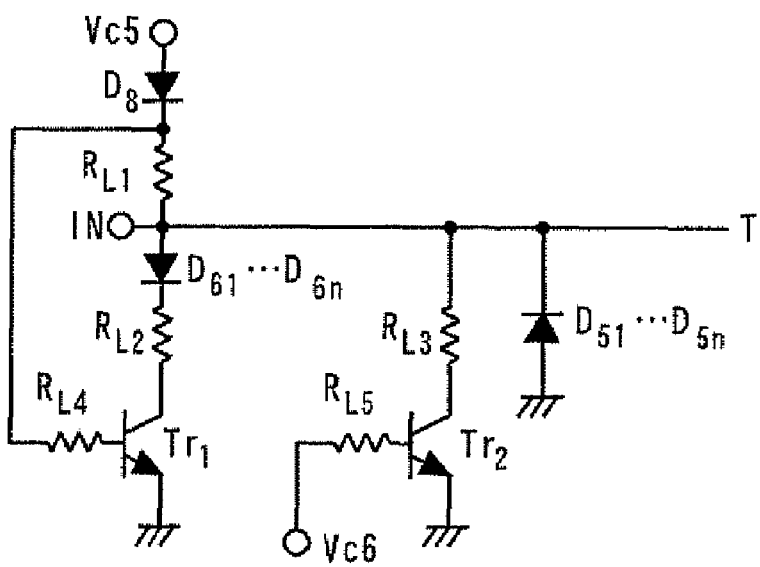
FIG. 5 is a circuit diagram showing a linearizer according to Embodiment 2 of the present invention.

FIG. 5 is a circuit diagram showing a linearizer according to Embodiment 2 of the present invention. This linearizer L further includes a resistor RL3 (fourth resistor) whose one end is connected to a connection point of an input terminal IN and the anode of a D1 diode and a second npn HBT Tr2 whose base is connected to a control voltage terminal Vc6 (sixth control voltage terminal) via a resistor RL5, whose emitter is grounded and whose collector is connected to the other end of the resistor RL3. The rest of the configuration is the same as that in Embodiment 1.

Here, when a high-level voltage is applied to control voltage terminals Vc1, Vc4 and a low-level voltage is applied to control voltage terminals Vc2 and Vc3, a low-level voltage is applied to the control voltage terminal Vc6. This causes the second npn HBT Tr2 to turn OFF. On the other hand, when a low-level voltage is applied to the control voltage terminals Vc1 and Vc4 and a high-level voltage is applied to the control voltage terminals Vc2 and Vc3, a high-level voltage is applied to the control voltage terminal Vc6. This causes the second npn HBT Tr2 to turn ON.

Therefore, according to this embodiment, it is possible to completely separate DC current paths of diodes D61 to D6$n$ operating in a thru state from those of diodes D51 to D5$n$ operating in an attenuation state. Here, in Embodiment 1, the behavior of both bias currents of the diodes D61 to D6$n$ operating in a thru state and the diodes D51 to D5$n$ operating in the attenuation state, that is, the gain characteristic of the linearizer L is determined by the same resistor RLT1, and therefore the degree of freedom of the design of the linearizer in the thru and attenuation states is low. On the other hand, this embodiment completely separates the DC paths, and thereby has an advantage that the degree of freedom of the design increases. Other effects are the same as those in Embodiment 1.

Embodiment 3

Figure 6:
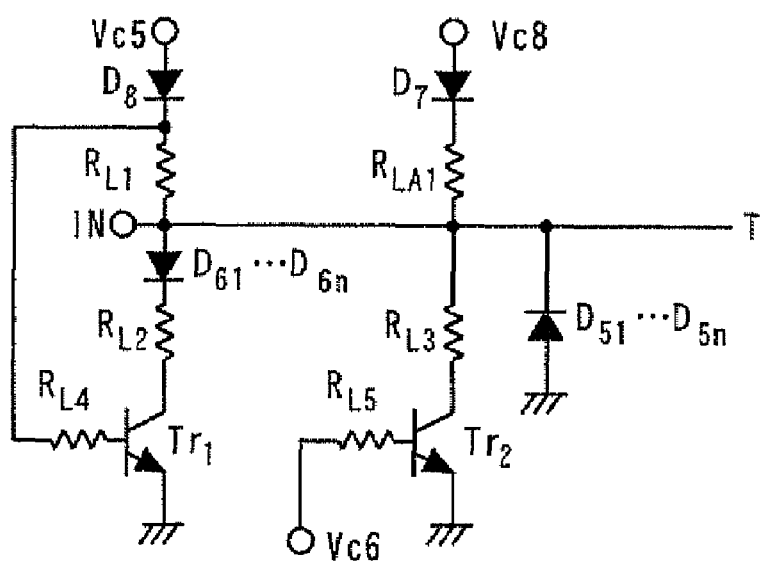
FIG. 6 is a circuit diagram showing a linearizer according to Embodiment 3 of the present invention.

FIG. 6 is a circuit diagram showing a linearizer according to Embodiment 3 of the present invention. This linearizer L further includes a diode D7 (seventh diode) whose anode is connected to a control voltage terminal Vc8 (eighth control voltage terminal) and a resistor RLA1 (seventh resistor) whose one end is connected to the cathode of the diode D7 and whose other end is connected to a connection point of an input terminal IN and the anode of a diode D1. The rest of the configuration is same as that in Embodiment 2.

While the diodes D51 to D5$n$ operating in the attenuation state in Embodiments 1 and 2 are zero-biased, in this embodiment 3, a voltage (for example, 2 to 5 V) is applied to a control voltage terminal Vc8, and it is thereby possible to adjust the gain compression characteristic of the linearizer L to a desired characteristic. Other effects are the same as those in Embodiment 2.

Embodiment 4

Figure 7:
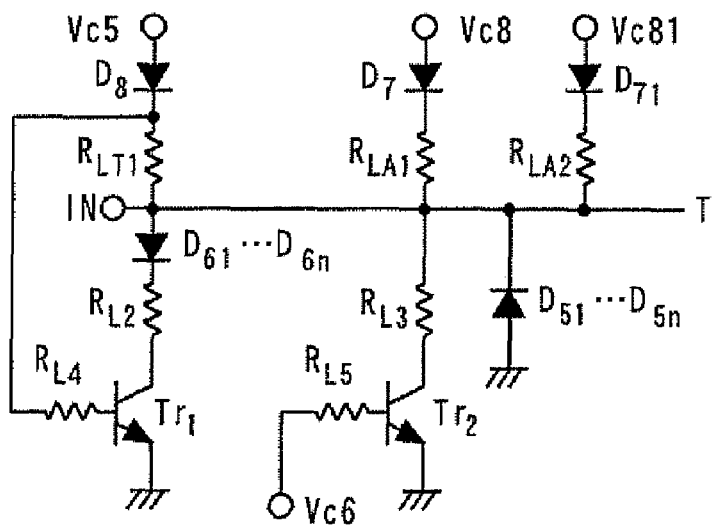
FIG. 7 is a circuit diagram showing a linearizer according to Embodiment 4 of the present invention.

FIG. 7 is a circuit diagram showing a linearizer according to Embodiment 4 of the present invention. This linearizer L further includes a diode D71 whose anode is connected to a control voltage terminal Vc81 and a resistor RLA2 whose one end is connected to the cathode of the diode D71 and whose other end is connected to a connection point of an input terminal IN and the anode of a diode D1. The rest of the configuration is same as that in Embodiment 3.

In this way, by using two control voltage terminals Vc8 and Vc81 as reverse-biased terminals of diodes D51 to D5$n$ operating in an attenuation state, it is possible to change the characteristic of the linearizer L operating in the attenuation state according to the temperature and the operating condition of the power amplifier. For example, it is possible to change adjustments only through application of a voltage to the control voltage terminal, for example, setting the output power level presenting a gain compression in FIG. 3 to approximately 15 dBm when using the control voltage terminal Vc8 and performing the same operation at an output power level of approximately 12 dBm when using the control voltage terminal Vc81. Other effects are the same as those in Embodiment 3.

Embodiment 5

Figure 8:
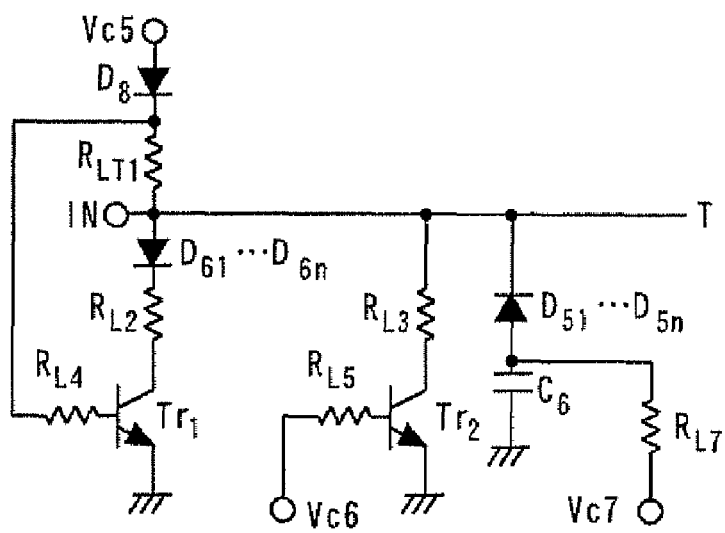
FIG. 8 is a circuit diagram showing a linearizer according to Embodiment 5 of the present invention.

FIG. 8 is a circuit diagram showing a linearizer according to Embodiment 5 of the present invention. This linearizer L further includes a capacitor C6 (sixth capacitor) provided between the anodes of diodes D51 to D5$n$ and a grounding point and a control voltage terminal Vc7 (seventh control voltage terminal) connected to a connection point of the anodes of the diodes D51 to D5$n$ and the capacitor C6. The rest of the configuration is the same as that in Embodiment 2.

Figure 3:
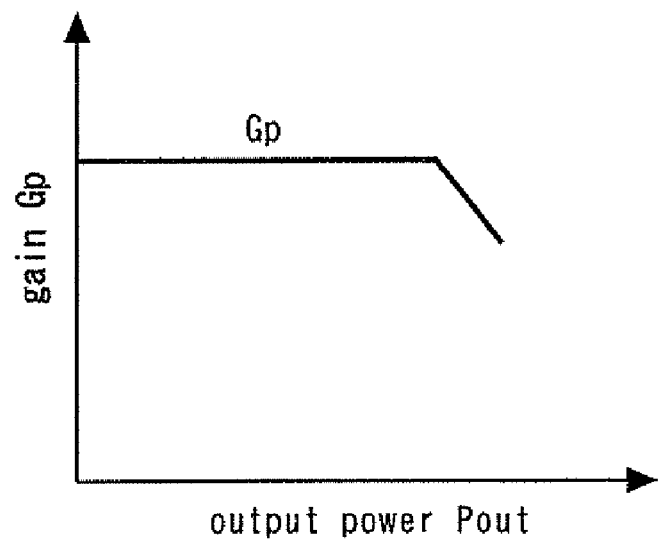
FIG. 3 shows an output characteristic of the linearizer in FIG. 2 in an attenuation state.

Here, Embodiments 1 to 4 apply a zero or a reverse bias to the diodes D51 to D5$n$ in the attenuation state and realize the characteristic in FIG. 3. However, at the output power level before the distortion characteristic of the attenuator in the attenuation state deteriorates, the power amplifier itself may present a gain compression characteristic. For example, this applies to a case where the bias condition of the power amplifier is changed between the thru and attenuation states (when reducing the bias current in the attenuation state rather than the bias current in the thru state for a low consumption current operation or the like).

On the other hand, in this embodiment, in the case of an attenuation state in which a low-level voltage is applied to control voltage terminals Vc1 and Vc4, and a high-level voltage is applied to control voltage terminals Vc2 and Vc3, a high-level voltage is applied to the control voltage terminal Vc7. That is, a zero or forward bias is applied to the diodes D51 to D5$n$ operating in the attenuation state. This causes the linearizer to exhibit a gain expansion characteristic even in the attenuation state, and therefore the distortion characteristic of the whole power amplifier can be improved. The other effects are the same as those in Embodiment 2.

Embodiment 6

Figure 9:
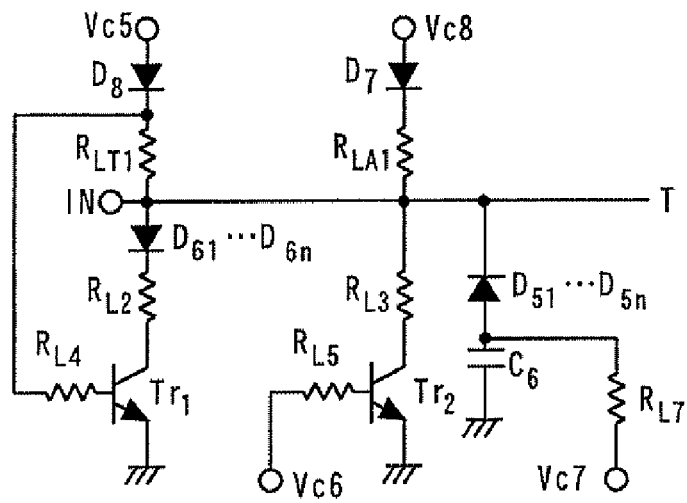
FIG. 9 is a circuit diagram showing a linearizer according to Embodiment 6 of the present invention.

FIG. 9 is a circuit diagram showing a linearizer according to Embodiment 6 of the present invention. This linearizer is a combination of the linearizer according to Embodiment 3 and the linearizer according to Embodiment 5.

In the case of an attenuation state in which a control voltage terminal Vc6 is high level, it is possible to apply an reverse bias to diodes D51 to D5n by driving a control voltage terminal Vc8 to a high level and apply a forward bias to the diodes D51 to D5n by driving a control voltage terminal Vc7 to a high level. This allows the gain compression/gain expansion characteristics to be switched according to the characteristic of the power amplifier. The other effects are the same as those in Embodiments 3 and 5.

Embodiment 7

Figure 10:
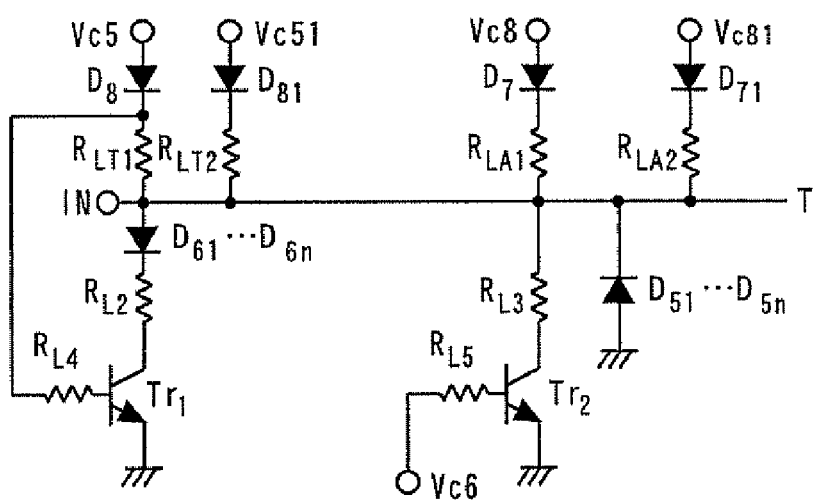
FIG. 10 is a circuit diagram showing a linearizer according to Embodiment 7 of the present invention.

FIG. 10 is a circuit diagram showing a linearizer according to Embodiment 7 of the present invention. This linearizer further includes a diode D81 whose anode is connected to a control voltage terminal Vc51 and a resistor RLT2 whose one end is connected to the cathode of the diode D81 and whose other end is connected to a connection point of an input terminal IN and the anode of a diode D1. The rest of the configuration is the same as that in Embodiment 4.

This allows the characteristic of the linearizer in a thru state to be changed by the control voltage terminals Vc5 and Vc51. For example, by driving the control voltage terminal Vc51 to a high level when the control voltage terminal Vc5 is high level, it is possible to provide parallel resistors of a resistor RLT1 and the resistor RLT2 as the resistor for the bias circuits of diodes D61 to D6n and increase a forward bias current. This allows the degree of gain expansion to be restrained. The other effects are the same as those in Embodiment 4.

Embodiment 8

Figure 11:
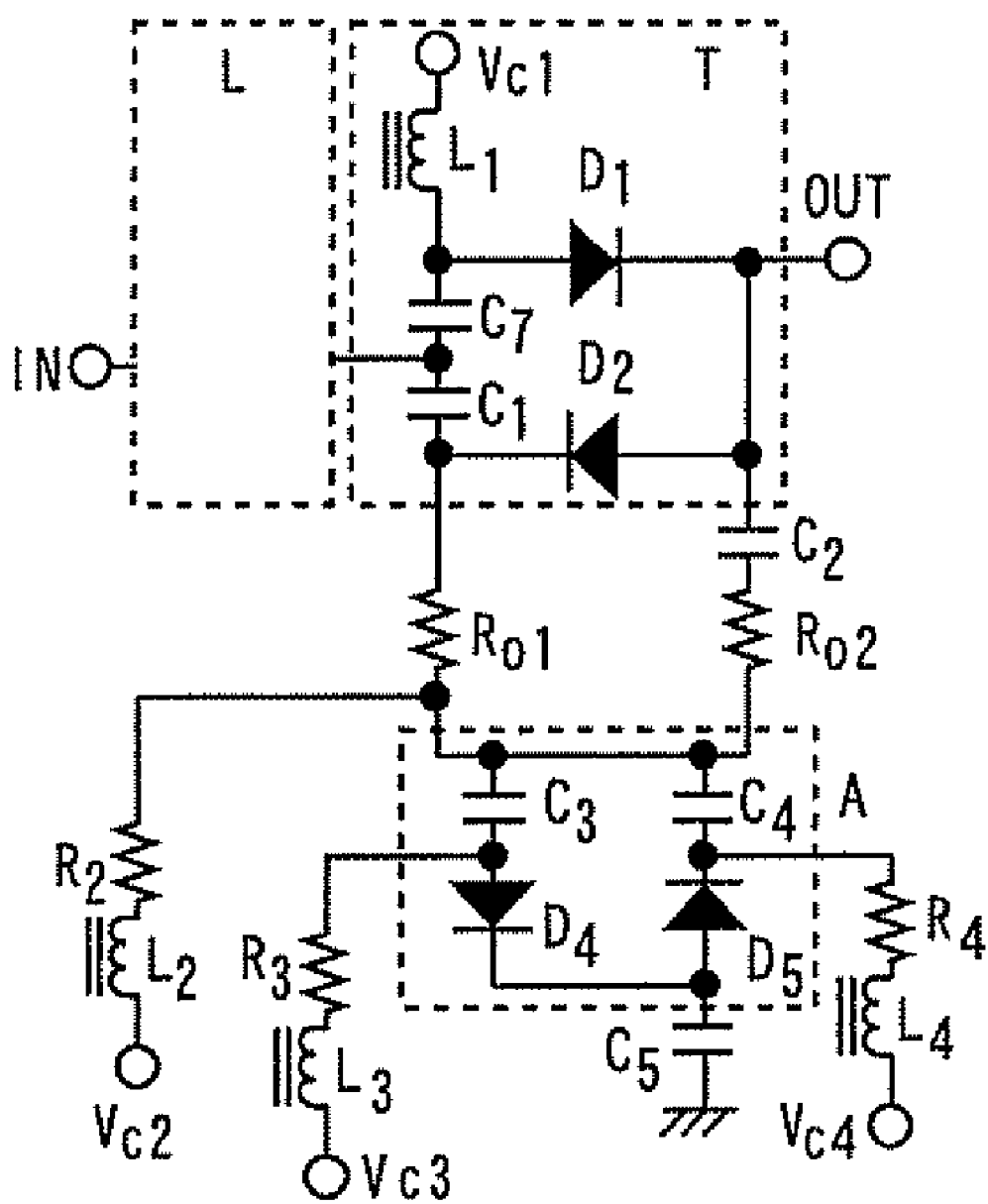
FIG. 11 is a circuit diagram showing an attenuator according to Embodiment 8 of the present invention.

FIG. 11 is a circuit diagram showing an attenuator according to Embodiment 8 of the present invention. This embodiment further includes a capacitor C7 (seventh capacitor) connected between a connection point of a capacitor C1 and an input terminal IN, and the anode of a diode D1. That is, the capacitance is divided into the capacitor C1 and the capacitor C7 in a through arm T. The rest of the configuration is the same as that in Embodiments 1 to 7.

This allows the power which passes through the diodes D1 and D2 to be equalized more than Embodiment 1 and provides circuit symmetry in terms of an alternating current, and thereby improves a distortion characteristic in a thru state. Therefore, the effects described in Embodiment 1 can be realized with low loss or a low control current. Furthermore, the amount of gain compensation which should be compensated by the linearizer can be reduced by an amount corresponding to reduced distortion and initial stage thru loss produced in the linearizer can be reduced. However, since impedance of the capacitors C1 and C2 is uniformly added, insertion loss increases slightly. The other effects are the same as those in Embodiments 1 to 7.

Embodiment 9

Figure 12:
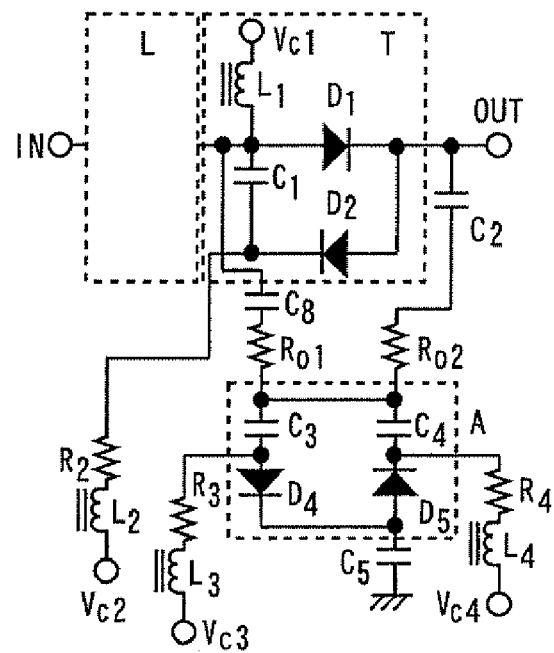
FIG. 12 is a circuit diagram showing an attenuator according to Embodiment 9 of the present invention.

FIG. 12 is a circuit diagram showing an attenuator according to Embodiment 9 of the present invention. In this embodiment, a control voltage terminal Vc2 is connected to the cathode of a diode D2 without passing through a resistor R01. Furthermore, one end of the resistor R01 is connected to the anode of a diode D1 via a capacitor C8 (eighth capacitor). The rest of the configuration is same as that in Embodiments 1 to 7.

First, since the control voltage terminal Vc2 is connected to the cathode of the diode D2 without passing through the resistor R01, there is no voltage drop at the resistor R01 and a greater bias current can be passed at the same control voltage. Furthermore, since the resistors R01, R02 and capacitors C8, C2 show circuit symmetry when viewed from a thru arm A, the distortion characteristic in the attenuation state can be improved. The other effects are the same as those in Embodiments 1 to 7.

Embodiment 10

Figure 13:
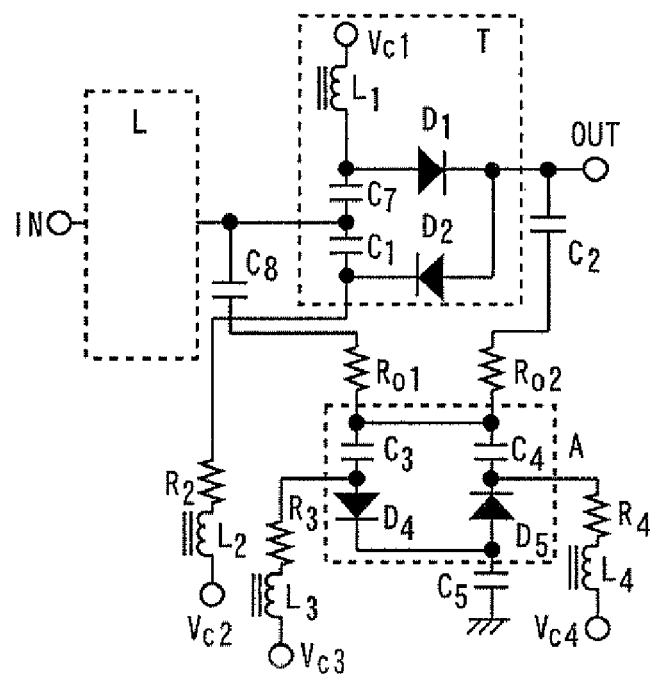
FIG. 13 is a circuit diagram showing an attenuator according to Embodiment 10 of the present invention.
Figure 14:
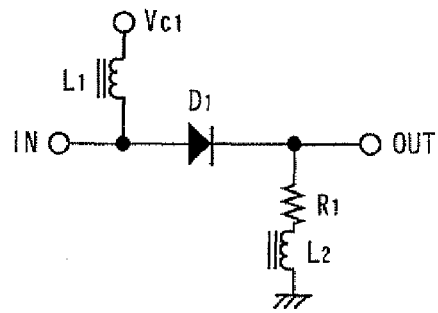
FIG. 14 is a circuit diagram showing a conventional switch.
Figure 15:
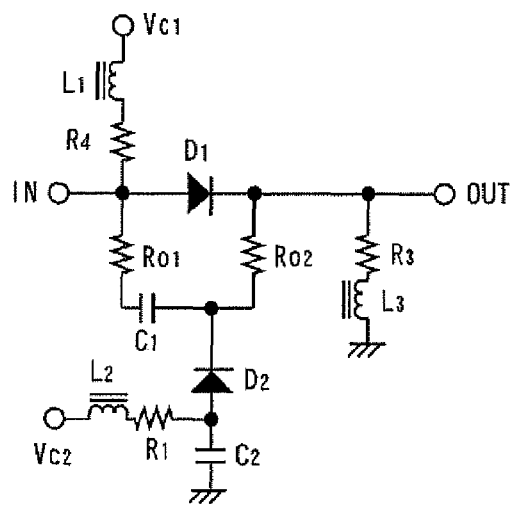
FIG. 15 is a circuit diagram showing a conventional attenuator.
Figure 16:
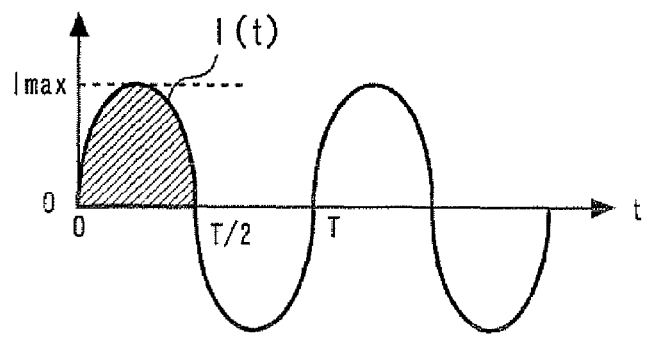
FIG. 16 shows an RF signal inputted from the input terminal.
Figure 17:
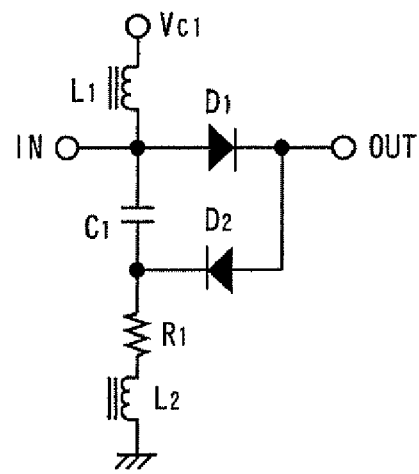
FIG. 17 is a circuit diagram showing a improved switch.
Figure 18:
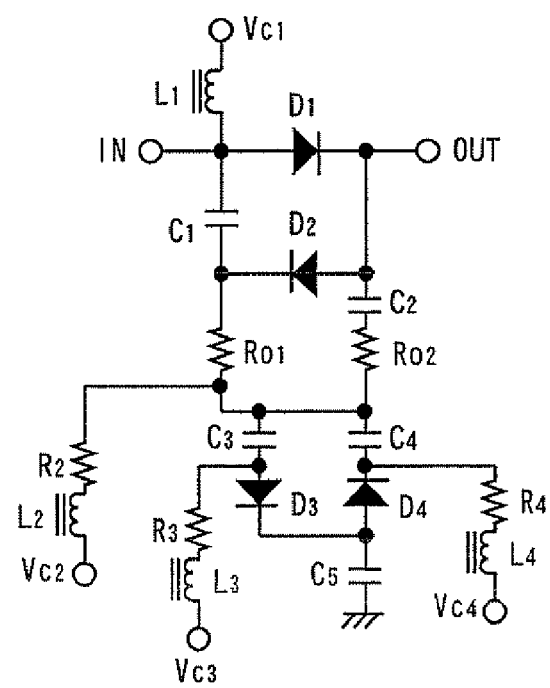
FIG. 18 is a circuit diagram showing a improved attenuator.
Figure 19:
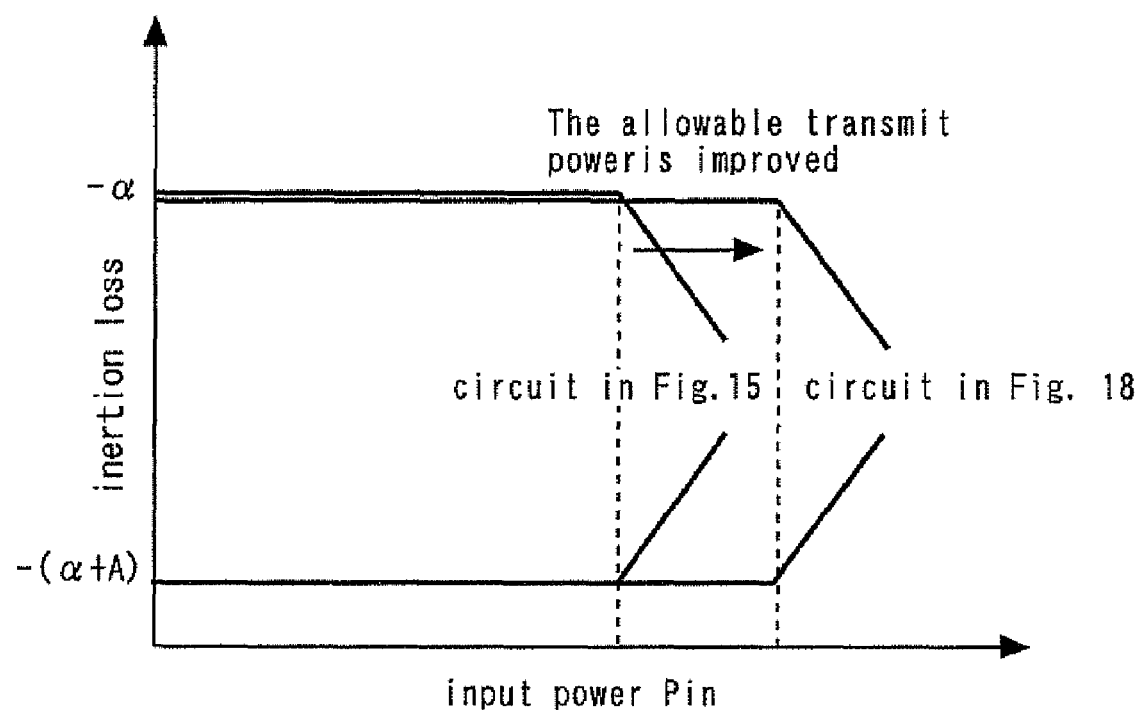
FIG. 19 shows a thru power characteristic of the attenuator in FIGS. 15 and 18.
Figure 20:
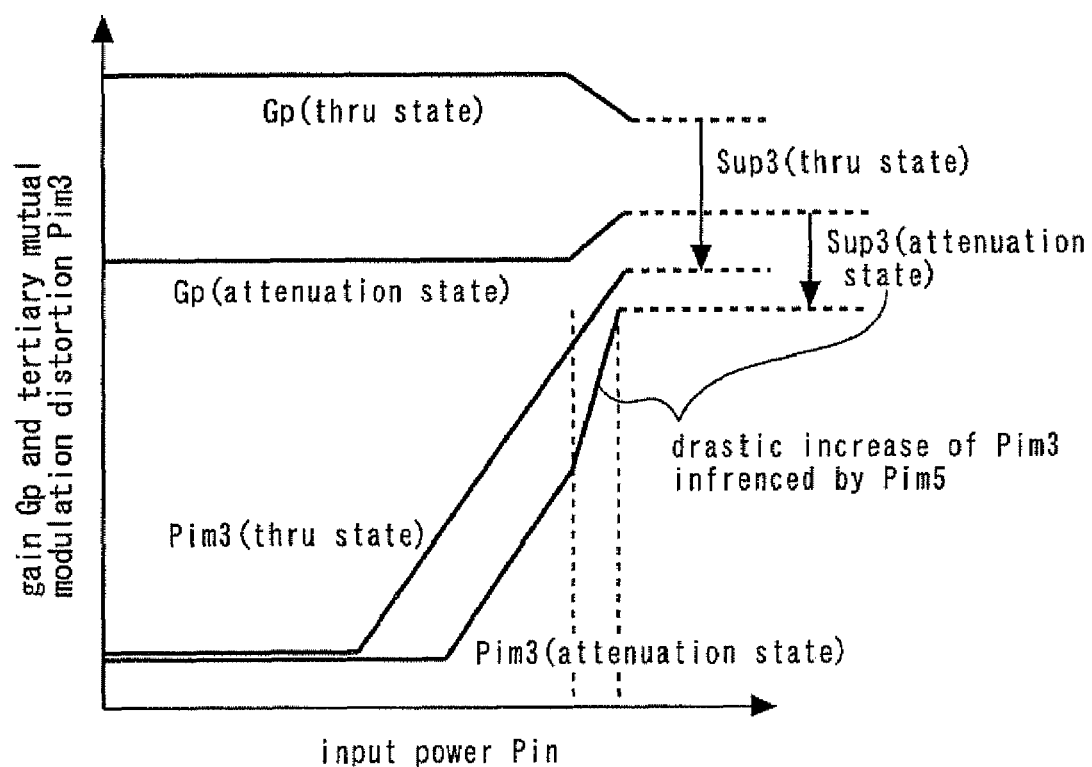
FIG. 20 shows an output characteristic of the attenuator in FIG. 18 in an attenuation state.

FIG. 13 is a circuit diagram showing an attenuator according to Embodiment 10 of the present invention. This embodiment further includes a capacitor C7 connected between a connection point of a capacitor C1 and an input terminal IN, and the anode of a diode D1. That is, the capacitance is divided into the capacitor C1 and the capacitor C7 in a thru arm T. The rest of the configuration is the same as that in Embodiment 9. In this way, this embodiment exerts effects similar to those in Embodiment 8 and Embodiment 9.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2006-278001, filed on Oct. 11, 2006 including specification, claims, drawings and summary, on which the Convention priority of the present application is based, are incorporated herein by reference in its entirety.

What is claimed is:

1. An attenuator comprising:
    a first diode having an anode connected to an input terminal and a cathode connected to an output terminal;
    a first control voltage terminal connected to the anode of the first diode;
    a first capacitor;
    a second diode having an anode connected to the cathode of the first diode and a cathode connected to the anode of the first diode via the first capacitor;
    a first resistor having a first end connected to the cathode of the second diode;
    a second capacitor;
    a second resistor having a first end connected to the cathode of the first diode via the second capacitor;
    a third capacitor;
    a third diode having an anode connected to second ends of the first resistor and the second resistor via the third capacitor;
    a fourth capacitor;
    a fourth diode having a cathode connected to the second ends of the first resistor and the second resistor via the fourth capacitor;
    a fifth capacitor having a first end connected to the cathode of the third diode and the anode of the fourth diode and a second end that is grounded;
    a second control voltage terminal connected to the cathode of the second diode;
    a third control voltage terminal connected to the anode of the third diode;

a fourth control voltage terminal connected to the cathode of the fourth diode; and a linearizer provided between the input terminal and the anode of the first diode, wherein the linearizer comprises a fifth diode having an anode that is grounded and a cathode connected to a connection point of the input terminal and the anode of the first diode, a third resistor connected between a connection point between the input terminal and the anode of the first diode, and a fifth control voltage terminal, a sixth diode having an anode connected to the input terminal, and a first npn heterojunction bipolar transistor (HBT) having a base connected to the fifth control voltage terminal, an emitter that is grounded, and a collector connected to the cathode of the sixth diode, and when a low-level voltage is applied to the first control voltage terminal and the fourth control voltage terminal and a high-level voltage is applied to the second control voltage terminal and the third control voltage terminal, a low-level voltage is applied to the fifth control voltage terminal, and when a high-level voltage is applied to the first control voltage terminal and the fourth control voltage terminal and a low-level voltage is applied to the second control voltage terminal and the third control voltage terminal, a high-level voltage is applied to the fifth control voltage terminal.

2. The attenuator according to claim 1, further comprising a sixth capacitor connected between a connection point of the first capacitor and the input terminal, and the anode of the first diode.

3. The attenuator according to claim 1, further comprising a sixth capacitor, wherein the first end of the first resistor is connected to the cathode of the second diode via the eighth capacitor.

4. The attenuator according to claim 1, wherein the linearizer further comprises:

a fourth resistor having a first end connected to a connection point of the input terminal and the anode of the first diode; and a second npn HBT having a base connected to a sixth control voltage terminal, an emitter that is grounded, and a collector connected to a second end of the fourth resistor, and when a high-level voltage is applied to the first control voltage terminal and the fourth control voltage terminal and a low-level voltage is applied to the second control voltage terminal and the third control voltage terminal, a low-level voltage is applied to the sixth control voltage terminal, and when a low-level voltage is applied to the first control voltage terminal and the fourth control voltage terminal and a high-level voltage is applied to the second control voltage terminal and the third control voltage terminal, a high-level voltage is applied to the sixth control voltage terminal.

5. The attenuator according to claim 4, wherein the linearizer further comprises:

a sixth capacitor provided between the anode of the fifth diode and a grounding point; and a seventh control voltage terminal connected to a connection point of the anode of the fifth diode and the sixth capacitor, and when a low-level voltage is applied to the first control voltage terminal and the fourth control voltage terminal and a high-level voltage is applied to the second control voltage terminal and the third control voltage terminal, a high-level voltage is applied to the seventh control voltage terminal.

6. The attenuator according to claim 4, wherein the linearizer further comprises:

a seventh diode having an anode connected to an eighth control voltage terminal; and a fifth resistor having a first end connected to the cathode of the seventh diode and a second end connected to a connection point of the input terminal and the anode of the first diode, wherein a gain compression characteristic of the linearizer is adjusted by a voltage applied to the eighth control voltage terminal.

* * * * *